(12) United States Patent
Graef et al.

(10) Patent No.: US 8,484,535 B2
(45) Date of Patent: Jul. 9, 2013

(54) ERROR-FLOOR MITIGATION OF CODES USING WRITE VERIFICATION

(75) Inventors: Nils Graef, Sunnyvale, CA (US); Kiran Gunnam, San Jose, CA (US)

(73) Assignee: Agere Systems LLC, Allentown, PA (US)

( * ) Notice: Subject to any disclaimer, the term of this patent is extended or adjusted under 35 U.S.C. 154(b) by 0 days.

(21) Appl. No.: 12/994,288

(22) PCT Filed: Apr. 21, 2009

(86) PCT No.: PCT/US2009/041215
§ 371 (c)(1),
(2), (4) Date: Nov. 23, 2010

(87) PCT Pub. No.: WO2010/123493
PCT Pub. Date: Oct. 28, 2010

(65) Prior Publication Data
US 2012/0030539 A1 Feb. 2, 2012

(51) Int. Cl.
*G11C 29/00* (2006.01)
(52) U.S. Cl.
USPC ............... 714/764; 714/752; 714/794
(58) Field of Classification Search
USPC ............. 714/764, 763, 752, 746, 755, 794, 714/786, 801
See application file for complete search history.

(56) References Cited

U.S. PATENT DOCUMENTS

| | | |
|---|---|---|
| 3,755,779 A | 8/1973 | Price |
| 4,295,218 A | 10/1981 | Tanner |
| 5,048,060 A | 9/1991 | Arai et al. |
| 5,721,745 A | 2/1998 | Hladik et al. |
| 5,734,962 A | 3/1998 | Hladik et al. |
| 6,023,783 A | 2/2000 | Divsalar et al. |
| 6,236,686 B1 | 5/2001 | Kamishima |
| 6,307,901 B1 | 10/2001 | Yu et al. |
| 6,550,023 B1 | 4/2003 | Brauch et al. |

(Continued)

FOREIGN PATENT DOCUMENTS

| | | |
|---|---|---|
| EP | 1926102 A1 | 5/2008 |
| EP | 1927987 A2 | 6/2008 |

(Continued)

OTHER PUBLICATIONS

Pusane, A.E.; Costello, D.J.; Mitchell, D.G.M;, "Trapping Set Analysis of Protograph-Based LDPC Convolutional Codes," Information Theory, 2009. ISIT 2009. IEEE International Symposium on, vol., No., pp. 561-565, Jun. 28-Jul. 3, 2009.

(Continued)

*Primary Examiner* — Fritz Alphonse
(74) *Attorney, Agent, or Firm* — Mendelsohn, Drucker & Associates, P.C.; Craig M. Brown; Steve Mendelsohn

(57) ABSTRACT

Executed when a channel input (e.g., LDPC) codeword is written to a storage medium, a write-verification method (i) compares the channel input codeword to the written codeword, (ii) identifies any erroneous bits, and (iii) stores the erroneous-bit indices to a record in a table. At some later time, the written codeword is read and sent to a decoder. If the decoder fails with a near codeword, a write-error recovery process searches the table and retrieves the erroneous-bit information. The codeword bits at those indices are adjusted, and the modified codeword is submitted to further processing.

16 Claims, 8 Drawing Sheets

U.S. PATENT DOCUMENTS

| | | | |
|---|---|---|---|
| 6,678,843 B2 | 1/2004 | Giulietti et al. | |
| 6,745,157 B1 | 6/2004 | Weiss et al. | |
| 6,760,879 B2 | 7/2004 | Giese et al. | |
| 6,888,897 B1 | 5/2005 | Nazari et al. | |
| 6,910,000 B1 | 6/2005 | Yedidia et al. | |
| 7,143,333 B2 | 11/2006 | Blankenship et al. | |
| 7,181,676 B2 | 2/2007 | Hocevar | |
| 7,219,288 B2 * | 5/2007 | Dielissen et al. | 714/752 |
| 7,237,181 B2 | 6/2007 | Richardson | |
| 7,296,216 B2 | 11/2007 | Shen et al. | |
| 7,340,671 B2 | 3/2008 | Jones et al. | |
| 7,353,444 B2 | 4/2008 | Owsley et al. | |
| 7,457,367 B2 | 11/2008 | Farhang-Boroujeny et al. | |
| 7,689,888 B2 | 3/2010 | Kan et al. | |
| 7,725,800 B2 | 5/2010 | Yang et al. | |
| 7,730,377 B2 | 6/2010 | Hocevar | |
| 7,739,558 B1 | 6/2010 | Farjadrad et al. | |
| 7,752,523 B1 | 7/2010 | Chaichanavong et al. | |
| 7,770,090 B1 | 8/2010 | Kons et al. | |
| 7,805,642 B1 | 9/2010 | Farjadrad | |
| 7,895,500 B2 | 2/2011 | Sun et al. | |
| 7,904,793 B2 | 3/2011 | Mokhlesi et al. | |
| 7,941,737 B2 | 5/2011 | Gopalakrishnan et al. | |
| 7,949,927 B2 | 5/2011 | Park et al. | |
| 8,010,869 B2 | 8/2011 | Wejn et al. | |
| 8,020,070 B2 | 9/2011 | Langner et al. | |
| 8,037,394 B2 | 10/2011 | Djurdjevic et al. | |
| 8,046,658 B2 | 10/2011 | Heinrich et al. | |
| 8,051,363 B1 | 11/2011 | Liu | |
| 8,103,931 B2 | 1/2012 | Wang et al. | |
| 8,127,209 B1 | 2/2012 | Zhang et al. | |
| 8,151,171 B2 | 4/2012 | Blanksby | |
| 8,156,409 B2 | 4/2012 | Patapoutian et al. | |
| 8,161,345 B2 | 4/2012 | Graef | |
| 8,171,367 B2 | 5/2012 | Gao et al. | |
| 8,205,134 B2 | 6/2012 | Harrison et al. | |
| 8,205,144 B1 | 6/2012 | Yadav | |
| 8,214,719 B1 * | 7/2012 | Sheng et al. | 714/763 |
| 8,219,878 B1 | 7/2012 | Varnica et al. | |
| 8,255,763 B1 | 8/2012 | Yang et al. | |
| 8,301,984 B1 | 10/2012 | Zhang et al. | |
| 2002/0062468 A1 | 5/2002 | Nagase et al. | |
| 2002/0166095 A1 | 11/2002 | Lavi et al. | |
| 2005/0132260 A1 | 6/2005 | Kyung et al. | |
| 2005/0193320 A1 | 9/2005 | Varnica et al. | |
| 2005/0204255 A1 | 9/2005 | Yeh et al. | |
| 2005/0204264 A1 | 9/2005 | Yusa | |
| 2005/0283707 A1 | 12/2005 | Sharon et al. | |
| 2006/0013306 A1 | 1/2006 | Kim et al. | |
| 2006/0036928 A1 | 2/2006 | Eroz et al. | |
| 2006/0107181 A1 | 5/2006 | Dave et al. | |
| 2006/0115802 A1 | 6/2006 | Reynolds | |
| 2006/0285852 A1 | 12/2006 | Xi et al. | |
| 2007/0011569 A1 | 1/2007 | Vila Casado et al. | |
| 2007/0011573 A1 | 1/2007 | Farjadrad et al. | |
| 2007/0011586 A1 | 1/2007 | Belogolovyi et al. | |
| 2007/0044006 A1 | 2/2007 | Yang et al. | |
| 2007/0071009 A1 | 3/2007 | Nagaraj et al. | |
| 2007/0089018 A1 | 4/2007 | Tang et al. | |
| 2007/0089019 A1 | 4/2007 | Tang et al. | |
| 2007/0124652 A1 | 5/2007 | Litsyn et al. | |
| 2007/0147481 A1 | 6/2007 | Bottomley et al. | |
| 2007/0153943 A1 | 7/2007 | Nissila | |
| 2007/0162788 A1 | 7/2007 | Moelker | |
| 2007/0220408 A1 | 9/2007 | Huggett et al. | |
| 2007/0234178 A1 | 10/2007 | Richardson et al. | |
| 2007/0234184 A1 | 10/2007 | Richardson | |
| 2008/0049869 A1 | 2/2008 | Heinrich et al. | |
| 2008/0082868 A1 | 4/2008 | Tran et al. | |
| 2008/0104485 A1 | 5/2008 | Lyakh et al. | |
| 2008/0109701 A1 | 5/2008 | Yu et al. | |
| 2008/0126910 A1 | 5/2008 | Venkatesan et al. | |
| 2008/0148129 A1 | 6/2008 | Moon | |
| 2008/0163032 A1 | 7/2008 | Lastra-Montano | |
| 2008/0235561 A1 | 9/2008 | Yang | |
| 2008/0276156 A1 | 11/2008 | Gunnam et al. | |
| 2008/0301517 A1 | 12/2008 | Zhong | |
| 2008/0301521 A1 | 12/2008 | Gunnam et al. | |
| 2008/0301530 A1 | 12/2008 | Spanel | |
| 2009/0063931 A1 | 3/2009 | Rovini et al. | |
| 2009/0083609 A1 | 3/2009 | Yue et al. | |
| 2009/0132897 A1 | 5/2009 | Xu et al. | |
| 2009/0150745 A1 | 6/2009 | Langner et al. | |
| 2009/0235146 A1 | 9/2009 | Tan et al. | |
| 2009/0259912 A1 | 10/2009 | Djordjevic et al. | |
| 2009/0273492 A1 | 11/2009 | Yang et al. | |
| 2009/0307566 A1 | 12/2009 | No et al. | |
| 2009/0319860 A1 | 12/2009 | Sharon et al. | |
| 2010/0037121 A1 | 2/2010 | Jin et al. | |
| 2010/0042806 A1 | 2/2010 | Gunnam | |
| 2010/0042890 A1 | 2/2010 | Gunnam | |
| 2010/0050043 A1 | 2/2010 | Savin | |
| 2010/0058152 A1 | 3/2010 | Harada | |
| 2010/0088575 A1 | 4/2010 | Sharon et al. | |
| 2011/0041029 A1 | 2/2011 | Yedidia et al. | |
| 2012/0135285 A1 | 5/2012 | Iwama et al. | |
| 2012/0139074 A1 | 6/2012 | Abe | |

FOREIGN PATENT DOCUMENTS

| | | |
|---|---|---|
| JP | 2007306495 A | 11/2007 |
| WO | WO03092170 A1 | 11/2003 |
| WO | WO2004079563 A1 | 9/2004 |
| WO | WO2007114724 A1 | 10/2007 |
| WO | WO2008004215 A2 | 1/2008 |
| WO | WO 2010/019168 A1 | 2/2010 |

OTHER PUBLICATIONS

Laendner, S.; Milenkovic, O.;, "LDPC Codes Based on Latin Squares: Cycle Structure, Stopping Set, and Trapping Set Analysis," Communications, IEEE Transactions on, vol. 55, No. 2, pp. 303-312, Feb. 2007.

Dehkordi, M.K,; Banihashemi, A.H.;, "An Efficient Algorithm for Finding Dominant Trapping Sets of LDPC Codes," Turbo Codes and Iterative Information Processing (ISTC), 2010 6th International Symposium on, pp. 444-448, Sep. 6-10, 2010.

C. A. Cole, S. G. Wilson, E. K. Hall and T. R. Giallorenzi, "A General Method for Finding Low Error Rates of LDPC Codes," http://arxiv.org/abs/cs.IT/0605051.

D. MacKay and M. Postol, "Weaknesses of margulis and ramanujan-margulis low-density parity-check codes," Electronic Notes in Theoretical Computer Science, vol. 74, 2003.

B. Xia and W. E. Ryan, "On importance sampling for linear block codes," Proc. 2003 IEEE International Conference on Communications, vol. 4, pp. 2904-2908, May 2003.

L. Dolecek, Z. Zhang, M. Wainwright, V. Anantharam, and B. Nikoli'c, "Evaluation of the low frame error rate performance of LDPC codes using importance sampling," 2007 IEEE Inform. Theory Workshop, Sep. 2-6, 2007.

K. Gunnam et al., "Value-Reuse Properties of Min-Sum for GF(q)" (dated Oct. 2006) Dept. of ECE, Texas A&M University Technical Note, published about Aug. 2010.

K. Gunnam et al., "Value-Reuse Properties of Min-Sum for GF (q)" (dated Jul. 2008) Dept. of ECE, Texas A&M University Technical Note, published about Aug. 2010.

K. Gunnam "Area and Energy Efficient VLSI Architectures for Low-Density Parity-Check Decoders Using an On-The-Fly Computation" dissertation at Texas A&M University, Dec. 2006.

Tuchler, M., et al., "Improved Receivers For Digital High Frequency Waveforms Using Turbo Equalization," Military Communications Conference; Milcom 2002 Proceedings; Anaheim, CA, Oct. 7-10, 2002; IEEE Military Communications Conference, New York, NY; IEEE; US, vol. 1, Oct. 7, 2002; pp. 99-104; XP002966498.

Alghonaim, E., et al., "Improving BER Performance of LDPC codes Based On Intermediate Decoding Results," Signal Processing and Communications; 2007; ICSPC, 2007; IEEE International Conference; IEEE; Piscataway, NJ; USA; Nov. 24, 2007; pp. 1547-1550; XP031380831.

Sripimanwat, K., "Turbo Code Applications: A Journey From A Paper To Realization", Oct. 26, 2005, Springer, p. 27.

Kiran Gunnam, Gwan Choi, Mark Yeary—"An LDPC decoding schedule for memory access reduction", IEEE International Conference on Acoustics, Speech, and Signal Processing (ICASSP) 2004, pp. 173-176, vol. 15.

Stefan Landner, Olgica Milenkovic—"Algorithmic and Combinatorial Analysis Of Trapping Sets in Structured LDPC Codes", International Conference on Wireless Networks, Communications and Mobile Computing, 2005, pp. 630-635, Vol. 1.

Hao Zhong,Tong Zhang—"Block—LDPC: A Practical LDPC Coding System Design Approach", IEEE transactions on circuits and systems—I: Regular Papers, Apr. 2005, pp. 766-775, vol. 52.

Kiran K. Gunnam, Gwan S. Choi, Weihuang Wang, Euncheol Kim, and Mark B. Yeary—"Decoding of Quasi-cyclic LDPC Codes Using an On-the-Fly Computation", Fortieth Asilomar Conference on Signals, Systems and Computers (ACSSC), 2006, pp. 1192-1199.

Thomas J. Richardson and Rudiger L. Urbanke—"Efficient Encoding of Low-Density Parity-Check Codes", IEEE Transactions on Information Theory, Feb. 2001,pp. 638-656,vol. 47, No. 2.

Tom Richardson—"Error Floors of LDPC Codes", IEEE Transactions on Information Theory, Feb. 2001, pp. 1426-1435,vol. 47, No. 2.

E. Papagiannis, C. Tjhai, M. Ahmed, M. Ambroze, M. Tomlinson—"Improved Iterative Decoding for Perpendicular Magnetic Recording", The ISCTA 2005 Conference on Feb. 4, 2005,pp. 1-4.

Kiran K. Gunnam, Gwan S. Choi, and Mark B. Yeary—"A Parallel VLSI Architecture for Layered Decoding for Array LDPC Codes", 20th International Conference on VLSI Design, 2007,6th International Conference on Embedded Systems, Jan. 2007 pp. 738-743.

David J.C. Mackay—"Information Theory, Inference, and Learning Algorithms", Cambridge University Press Sep. 2003, p. 640.

R. Michael Tanner, Deepak Sridhara, Arvind Sridharan, Thomas E. Fuja, and Daniel J. Costello, Jr—"LDPC Block and Convolutional Codes Based on Circulant Matrices", IEEE Transactions on Information Theory, Dec. 2004, pp. 2966-2984, vol. 50, No. 12.

Amin Shokrollahi—"LDPC Codes: An Introduction, In Coding, Cryptography and Combinatorics",Computer Science and Applied Logic, Birkhauser, Basel, 2004, pp. 85-110, vol. 23.

Yang Han and William E. Ryan—"LDPC Decoder Strategies for Achieving Low Error Floors", Proceedings of Information Theory and Applications Workshop, San Diego, CA, Jan. 2008, pp. 1-10.

Mohammad M. Mansour and Naresh R. Shanbhag—"Low Power VLSI decoder architectures for LDPC codes" International Symposium on Low Power Electronics and Design Proceedings of the 2002 , ICIMS Research Center, 2002, pp. 284-289.

Dale E. Hocevar—"A Reduced Complexity Decoder Architecture Via Layered Decoding of LDPC Codes", IEEE Workshop on Signal Processing Systems, 2004, pp. 107-112.

Robert G. Gallager—"Low Density Parity—Check Codes",Cambridge Mass Jul. 1963,p. 90.

T. Richardson and R. Urbanke—"Modern Coding Theory", Cambridge University Press, Preliminary version—Oct. 18, 2007, p. 590.

Kiran Gunnam, Gwan Choi, Weihuang Wang, Mark Yeary—"Multi-Rate Layered Decoder Architecture for Block LDPC Codes of the IEEE 802, 11n Wireless Standard", IEEE International Symposium on Circuits and Systems (ISCAS) 2007, pp. 1645-1648.

Kiran K. Gunnam, Gwan S. Choi, Mark B. Yeary, Shaohua Yang and Yuanxing Lee—"Next Generation Iterative LDPC Solutions for Magnetic Recording Storage", 42nd Asilomar Conference on Signals, Systems and Computers, 2008, pp. 1148-1152.

D.J.C. Mackay and R.M. Neal—"Near Shannon limit performance of low density parity check codes", Electronics Letters Mar. 13, 1997, pp. 458-459, vol. 33 No. 6.

Jinghu Chen, Ajay Dholakia, Evangelos Eleftheriou, Marc P. C. Fossorier, Xiao-Yu Hu, "Reduced-Complexity Decoding of LDPC Codes", IEEE Transactions on Communications, Aug. 2005, pp. 1288-1299,vol. 53, No. 8.

Kiran K. Gunnam, Gwan S. Choi, Mark B. Yeary and Mohammed Atiquzzaman—"VLSI Architectures for Layered Decoding for Irregular LDPC Codes of WiMax", IEEE International Conference on Communications (ICC), 2007, pp. 4542-4547.

Andrew J. Blanksby and Chris J. Howland—"A 690-mW 1-Gb/s 1024-b, Rate-1/2 Low-Density Parity-Check Code Decoder", IEEE Journal of Solid-State Circuits, Mar. 2002.pp. 404-412,vol. 37, No. 3.

Kiran Gunnam, Weihuang Wang, Gwan Choi, Mark Yeary—"VLSI Architectures for Turbo Decoding Message Passing Using Min-Sum for Rate-Compatible Array LDCP Codes", 2nd International Symposium on Wireless Pervasive Computing (ISWPC), 2007, pp. 561-566.

Kiran K. Gunnam, Gwan S. Choi, Weihuang Wang, and Mark B. Yeary—"A Parallel VLSI Architecture for Layered Decoding",Proceedings of the 20th International Conference on VLSI Design, 6th International Conference: Embedded Systems, 2007, pp. 738-743.

R.Michael Tanner—"A Recursive Approach to Low Complexity Codes",IEEE transaction on Information Theory, Sep. 1981,pp. 533-547,vol. IT-27, No. 5.

Mohammad M. Mansour, and Naresh R. Shanbhag—"A 640-Mb/s 2048-Bit Programmable LDPC Decoder Chip", IEEE Journal of Solid-State Circuits, Mar. 2006, pp. 684-698,vol. 41, No. 3.

Badri N. Vellambi R, and Faramarz Fekri, "An Improved Decoding Algorithm for Low-Density Parity-Check Codes over the Binary Erasure Channel", IEEE GLOBECOM 2005 proceedings, pp. 1182-1186.

Yang Han, William E. Ryan—"Low-Floor Decoders for LDPC Codes", IEEE Transactions on Communications, vol. 57, No. 6, Jun. 2009, pp. 1663-1673.

PCT International Search Report dated Feb. 9, 2009 from International Application No. PCT/US 08/86537.

PCT International Search Report dated May 15, 2009 from International Application No. PCT/US 09/39279.

PCT International Search Report dated Feb. 12, 2009 from International Application No. PCT/US 08/86523.

PCT International Search Report dated May 28, 2009 from International Application No. PCT/US 09/41215.

PCT International Search Report dated May 15, 2009 from International Application No. PCT/US 09/39918.

Vila Casado, Andres I., Weng, Wen-Yen and Wesel, Richard D. "Multiple Rate Low-Density Parity-Check Codes with Constant Blocklength," IEEE 2004, pp. 2010-2014.

Vila Casado, Andres I. "Variable-rate Low-denisty Parity-check Codes with Constant Blocklength," UCLA Technologies Available for Licensing Copyright © 2009 The Regents of the University of California. http://www.research.ucla.edu/tech/ucla05-074.htm (2 pages).

Vila Casado, Andres I., Weng, Wen-Yen, Valle, Stefano and Wesel, Richard D. "Multiple-Rate Low-Density Parity-Check Codes with Constant Blocklength," IEEE Transactions on Communications, vol. 57, No. 1, Jan. 2009; pp. 75-83.

Gunnam, Kiran K., Choi, Gwan S., and Yeary, Mark B., "Technical Note on Iterative LDPC Solutions for Turbo Equalization," Texas A&M Technical Note, Department of ECE, Texas A&M University, College Station, TX 77843, Jul. 2006 (available online at http://dropzone.tamu.edu), pp. 1-5.

Richardson, Tom, "Error Floors of LDPC Codes," Allerton Conf. on Communication, Control and Computing, (Monticello, Illinois), Oct. 2003, pp. 1426-1435.

Cole, Chad A. and Hall, Eric K., "Analysis and Design of Moderate Length Regular LDPC Codes with Low Error Floors," Proc, 40th Conf. Information Sciences and Systems, Princeton, NJ, 2006, 6 pgs.

Cavus et al., "A Performance Improvement and Error Floor Avoidance Technique for Belief Propagation Decoding of LDPC Codes," IEEE 16th International Symposium, Personal, Indoor & Mobile Radio Communications (PIMRC), Berlin, Germany Sep. 11-14, 2005, pp. 2386-2390.

Cavus, Enver et al., "An IS Simulation Technique for Very Low BER Performance Evaluation of LDPC Codes," IEEE International Conference on Communications, Jun. 1, 2006, pp. 1095-1100.

European Search Report dated Dec. 19, 2012 from corresponding EP Application No. 09843763.5.

Casado, V., et al., "Informed Dynamic Scheduling for Belief-Propagation Decoding of LDPC Codes," IEEE International Conference on Communications, Jun. 24-28, 2007, pp. 932-937.

* cited by examiner

| CODEWORD_IDENTIFIER | EB_INDICES | COMPLETE_SET |
|---|---|---|
| 4002 | 3, 42, 101 | 0 |
| 391 | 30, 1007 | 1 |

US 8,484,535 B2

ERROR-FLOOR MITIGATION OF CODES USING WRITE VERIFICATION

CROSS-REFERENCE TO RELATED APPLICATIONS

The subject matter of this application is related to (1) the subject matter of PCT application no. PCT/US08/86523 filed on Dec. 12, 2008, (2) the subject matter of PCT application no. PCT/US08/86537 filed on Dec. 12, 2008, (3) the subject matter of U.S. application Ser. No. 12/401,116 filed on Mar. 10, 2009, (4) the subject matter of PCT application no. PCT/US09/39279 filed on Apr. 2, 2009, (5) the subject matter of U.S. application Ser. No. 12/420,535 filed on Apr. 8, 2009, (6) the subject matter of U.S. patent application Ser. No. 12/113,729 filed on May 1, 2008, (7) the subject matter of U.S. patent application Ser. No. 12/113,755 filed on May 1, 2008, and (8) the subject matter of PCT application no. PCT/US09/39918 filed on Apr. 8, 2009, the teachings of all of which are incorporated herein by reference in their entirety.

BACKGROUND OF THE INVENTION

1. Field of the Invention

The invention relates to digital signal processing, and, in particular, to data-encoding methods such as low-density parity check (LDPC) coding.

2. Description of the Related Art

Communication is the transmission of information from a transmitter to a receiver over a communications channel. In the real world, the communications channel is a noisy channel, providing to the receiver a distorted version of the information transmitted from the transmitter. A storage device (e.g., hard disk (HD) drive, flash drive) is one such noisy channel, accepting information from a transmitter, storing that information, and then providing a more or less distorted version of that information to a receiver.

The distortion introduced by a communications channel such as a storage device might be great enough to cause a channel error, i.e., where the receiver interprets the channel output signal as a 1 when the channel input signal was a 0, or vice versa. Channel errors reduce throughput and are thus undesirable. Hence, there is an ongoing need for tools that detect and/or correct channel errors. Low-density parity check (LDPC) coding is one method for the detection and correction of channel errors.

LDPC codes are among the known near-Shannon-limit codes that can achieve very low bit-error rates (BER) for low signal-to-noise ratio (SNR) applications. LDPC decoding is distinguished by its potential for parallelization, low implementation complexity, low decoding latency, as well as less-severe error-floors at high SNRs. LDPC codes are considered for virtually all the next-generation communication standards.

SUMMARY OF THE INVENTION

In one embodiment, the present invention is a machine-implemented method for storing an original encoded codeword to a storage medium. The original encoded codeword is written to the storage medium as a written encoded codeword. A channel output codeword is generated by reading the written encoded codeword from the storage medium. The original encoded codeword is compared to a derived codeword based on the channel output codeword to identify a first set of one or more erroneous bits in the written encoded codeword. A second set of one or more erroneous bits in the written encoded codeword is generated by selecting one or more erroneous bits in the first set. Erroneous-bit information corresponding to the one or more erroneous bits in the second set is written to the storage medium.

In another embodiment, the present invention is a machine-implemented method for generating a decoded codeword for a written encoded codeword stored in a storage medium, the written encoded codeword having one or more erroneous bits. A channel output codeword is generated by reading the written encoded codeword from the storage medium. A derived codeword based is generated from the channel output codeword. Erroneous-bit information is read from the storage medium, wherein the erroneous-bit information corresponds to one or more erroneous bits in the written encoded codeword. The erroneous-bit information is used to generate a modified codeword. Further processing is performed on the modified codeword to generate the decoded codeword.

BRIEF DESCRIPTION OF THE DRAWINGS

Other aspects, features, and advantages of the invention will become more fully apparent from the following detailed description, the appended claims, and the accompanying drawings in which like reference numerals identify similar or identical elements.

FIG. 5 is a diagram of one embodiment of an erroneous-bit table.

DETAILED DESCRIPTION

Figure 1:
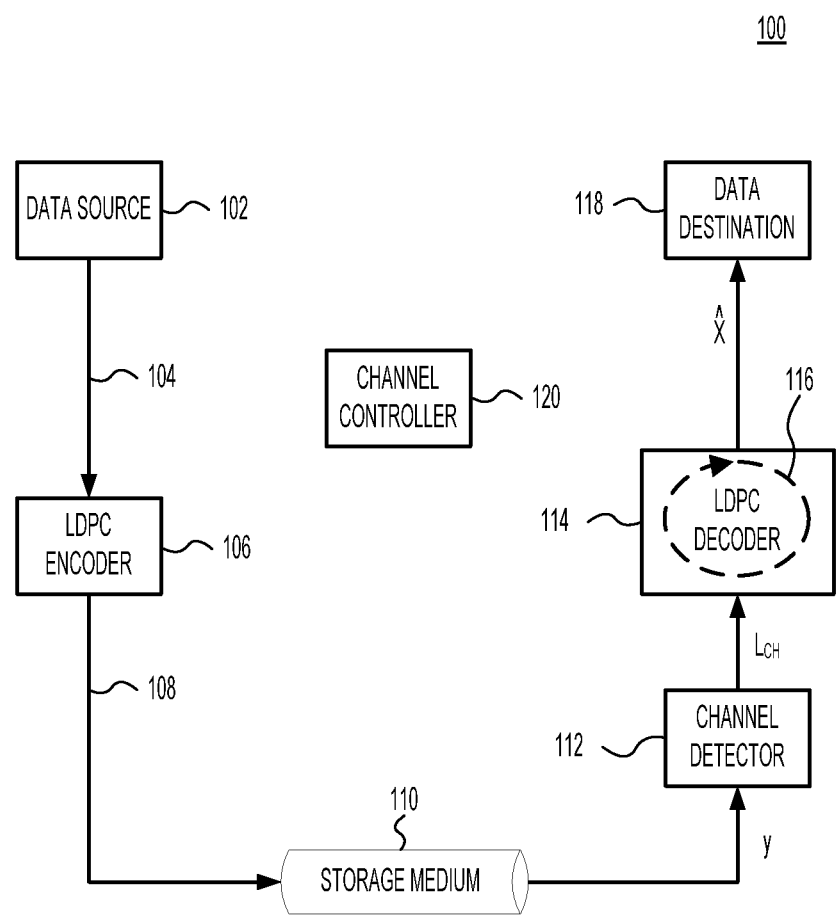
FIG. 1 is a block diagram of communication system 100 that utilizes LDPC coding.

FIG. 1 is a block diagram of a communications system 100 that utilizes LDPC coding. Data source 102 generates a set of bits known as an original information word 104. LDPC encoder 106 encodes original information word 104 to generate original encoded codeword 108. LDPC encoding is discussed in greater detail below. Original encoded codeword 108 (also known as the channel input codeword) is written to storage medium 110 (e.g., a flash drive, hard-drive platter, etc) as a written encoded codeword.

At some later time, storage medium 110 reads the written encoded codeword and outputs a set of values y (i.e., a channel output codeword) to channel detector 112. The channel output codeword and any codeword derived from the channel output codeword are known as derived codewords. Channel detector 112 converts the received values y into a set of log-likelihood ratio (LLR) values $L_{ch}$. An LLR value comprises (i) a sign bit that represents the decoder's best guess as to the one-bit hard-decision value indicated by the corresponding value y and (ii) one or more magnitude bits that represent the decoder's confidence in the hard decision. For example, channel detector 112 might output each LLR value $L_{ch}$ as a five-bit value, where the most-significant bit is a sign bit that indicates the hard decision, and the value of the four magnitude bits indicates the confidence of the hard decision. Thus, in one possible LLR scheme, an LLR value of binary 00000 indicates a hard decision of 0 with least confidence, an LLR value of binary 01111 indicates a hard decision of 0 with maximum confidence, an LLR value of binary 10001 indicates a hard decision of 1 with least confidence, and an LLR value of binary 11111 would indicate a hard decision of 1 with maximum confidence, where binary 10000 is unused.

Channel detector 112 sends the $L_{ch}$ values to LDPC decoder 114, where they become a decoder input codeword. LDPC decoder 114 then performs one or more decoding iterations 116 ("local iterations") on a set of $L_{ch}$ values to generate decoded codeword $\hat{x}$. LDPC decoder AC terminates when either (i) LDPC decoder 114 arrives at a decoded correct codeword (DCCW), i.e., $\hat{x}$ is the same as channel input codeword 108, or (ii) LDPC decoder AC performs a maximum allowable number of local iterations without arriving at the DCCW, i.e., LDPC decoder 114 has failed. When decoder 114 terminates, it outputs decoded codeword $\hat{x}$ to data destination 118. LDPC decoding is described in greater detail below.

Channel controller 120 controls the operations of at least LDPC encoder 106, channel detector 112, and LDPC decoder 114. The channel controller is typically an ARM (Advanced RISC (reduced instruction-set code) Machine) processor.

LDPC Encoding

To create codeword 108, LDPC encoder 106 appends to the bits of information word 104 a number of parity bits specified by the LDPC code. The number of bits in information word 104 is denoted K. The bits in an encoded codeword are known as variable bits, and the number of those variable bits is denoted N. Thus, the number of parity bits is given by N−K.

Each parity bit in an LDPC codeword is associated with one or more other bits in that codeword in a particular way as specified by the particular LDPC code, and the value assigned to a parity bit is set so as to satisfy the LDPC code. Typical LDPC codes specify that the parity bit and its associated bits satisfy a parity-check constraint, e.g., the sum of the bits is an even number, i.e., sum modulo 2=0.

The LDPC Code

A particular LDPC code is defined by a two-dimensional matrix of 1s and 0s known as the parity-check matrix, or H matrix, or simply H. H is known, a priori, by both the LDPC encoder and decoder. H comprises N columns and N−K rows, i.e., a column for every bit of the codeword, and a row for every parity bit. Each 1 in H represents an association between the codeword bit of the column and the parity bit of the row. For example, a 1 at the third row, seventh column of H means that the third parity-check bit is associated with the seventh bit of the codeword. The sum modulo 2 of the value of a check bit and all variable bits associated with that check bit should be 0. A defining characteristic of typical LDPC codes is that H is "sparse," i.e., the elements of H are mostly 0s with relatively few 1s.

Figure 2:
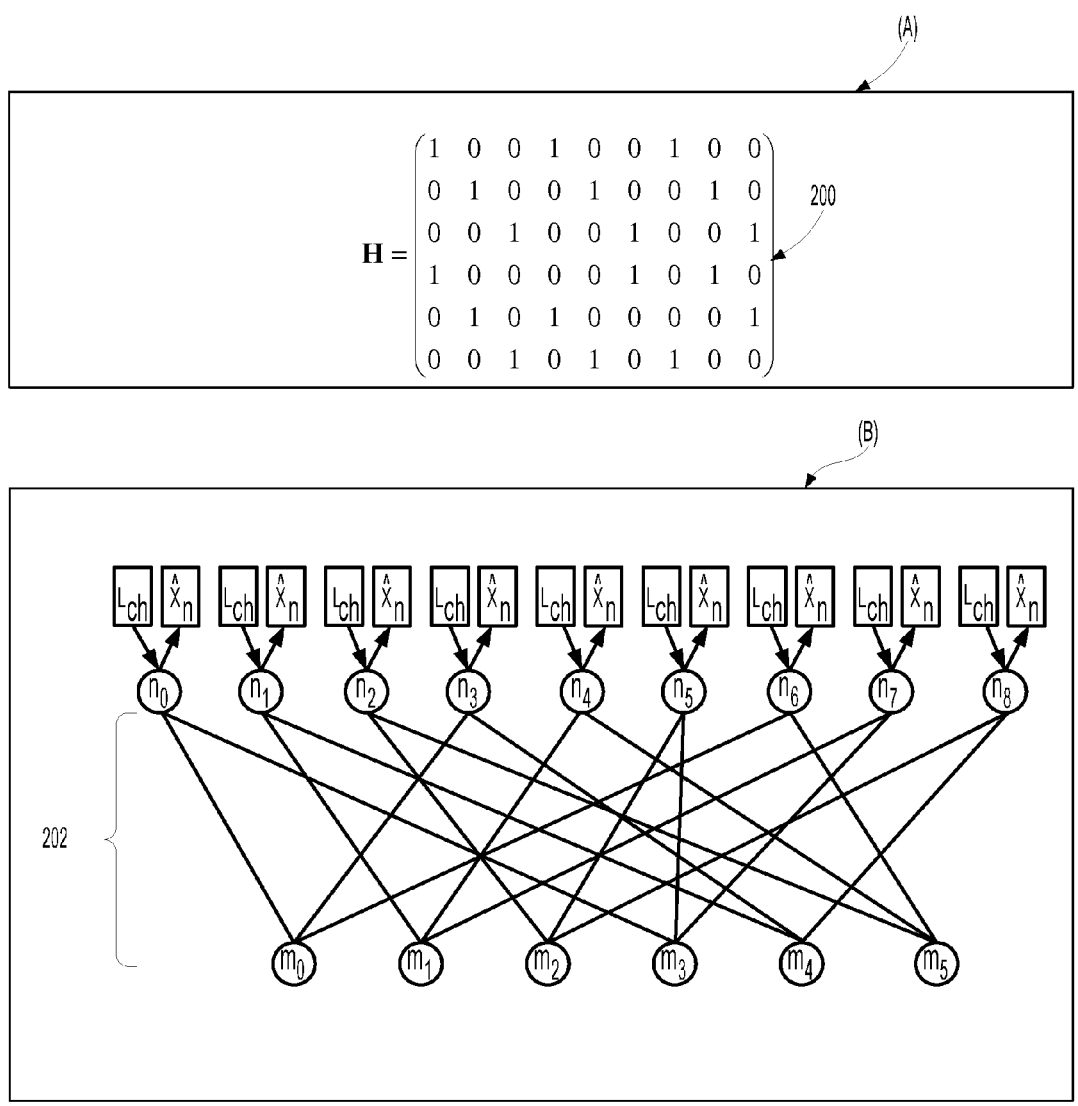
FIG. 2(A) depicts LDPC H matrix 200.
FIG. 2(B) is a Tanner graph of H matrix 200.

FIG. 2(A) depicts LDPC H matrix 200. H matrix 200 comprises N=9 columns and N−K=6 rows. Thus, H matrix 200 defines an LDPC code that accepts a three-bit information word, appends six parity bits, and outputs a nine-bit codeword. In one implementation in which the storage medium is a hard-disk drive or a flash drive, each information word is 4,096 bits in length, and each codeword is 4,552 bits in length. Other implementations may have information words and/or codewords having other bit lengths.

LDPC Decoding: Belief Propagation

Figure 3:
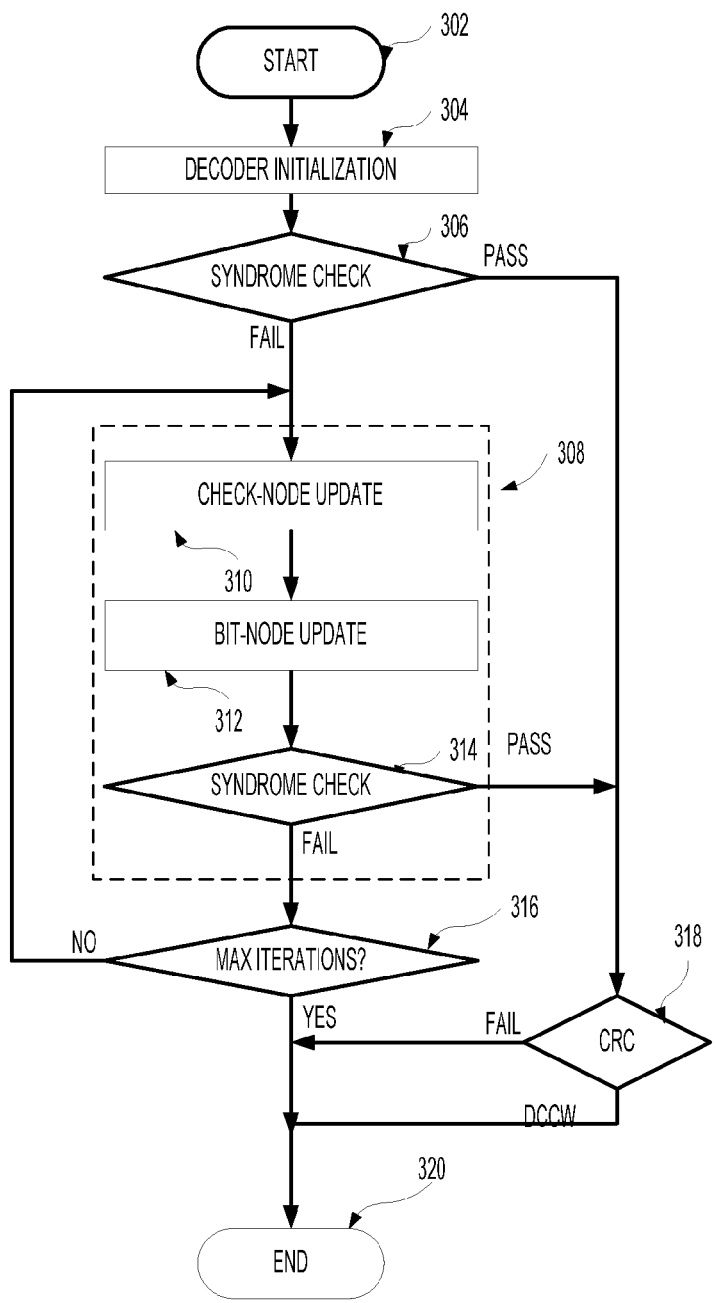
FIG. 3 is a flowchart of LDPC decoding method 300 used by decoder AC of FIG. A.

FIG. 3 is a flowchart of LDPC decoding method 300 used by decoder 114 of FIG. 1. The heart of decoding method 300 is an iterative, two-phase message-passing algorithm called belief propagation. Belief propagation can be explained with the use of a Tanner graph.

FIG. 2(B) is a Tanner graph for H matrix 200. In general, a Tanner graph comprises 1) a number of bit nodes (also known as variable nodes) n equal to the number of columns in H (and thus equal to the number N of variable bits, 2) a number of check nodes m equal to the number of rows in H (and thus equal to number of parity bits), 3) edges 202, each of which connects a single bit node n, to a single check node $m_j$, 4) for each bit node $n_i$, the original $L_{ch}$ value, and 5) for each bit node $n_i$, a calculated hard-decision output value $\hat{x}_n$. The Tanner graph of FIG. 2(B) comprises nine bit nodes $n_0$-$n_8$, six check nodes $m_0$-$m_5$, 18 edges 202 connecting bit nodes to check nodes, nine $L_{ch}$ values, and nine $\hat{x}_n$ values.

The edges in a Tanner graph represent the relationships between bit nodes n and check nodes m, where edges represent 1s in H. For example, in FIG. 2(B), an edge 202 connects first bit node $n_0$ to fourth check node $m_3$, because there is a 1 in the first column, fourth row of H matrix 200 in FIG. 2(A).

A Tanner graph is a bipartite graph, i.e., an edge can connect a bit node to only a check node, and cannot connect a bit node to another bit node, or a check node to another check node. The set of all bit nodes n connected by edges to a particular check node m is denoted N(m). The set of all check nodes m connected by edges to a particular bit node n is denoted M(n). The index of a particular (bit or check) node is its ordinal sequence in the graph.

Returning to FIG. 3, processing starts at step 302 and proceeds to step 304, decoder initialization. Decoder initialization 304 comprises setting all edges (e.g., edges 202 of FIG. 2(B)) connected to each bit node n to the corresponding $L_{ch}$ value associated with bit node n, and setting the $\hat{x}_n$ value of bit node n to the hard-decision value (i.e., MSB) of bit node n's $L_{ch}$. Thus, for example, in FIG. 2(B), if the $L_{ch}$ value associated with bit node $n_0$ is the decimal value +5, then, at step 304, the two edges 202 connecting bit node $n_0$ to check nodes $m_0$ and $m_3$ are set to +5, and bit node $n_0$'s $\hat{x}_n$ value is set to 1. An alternative way of expressing the first part of this step is that bit node $n_0$ sends a message of +5 to each check node m in set M($n_0$). A message sent from a bit node n to a check node m is called a bit-node or Q message, and is denoted $Q_{nm}$.

Step 304 then sends to syndrome check step 306 a candidate decoded codeword vector $\hat{x}$ comprising the N $\hat{x}_n$ values. Syndrome check step 306 calculates syndrome vector z using the following Equation (1):

$$z = \hat{x} H^T \quad (1)$$

where $H^T$ is the transpose of the H matrix. If syndrome vector z is a 0 vector, then vector $\hat{x}$ has satisfied all the parity-check constraints defined by H, i.e., $\hat{x}$ is a valid decoded codeword. In that case, processing proceeds to cyclic-redundancy check (CRC) check 318.

If, instead, syndrome vector z is not a 0 vector, then vector $\hat{x}$ fails one or more of the parity-check constraints. Each non-zero element in syndrome vector z represents a failed parity-check constraint, which is also referred to as unsatisfied check node (USC). The number of non-zero elements in syndrome vector z is the number b of USCs in vector $\hat{x}$. Further, the indices of the non-zero elements of syndrome vector z are the indices of the USCs in vector $\hat{x}$.

If vector $\hat{x}$ fails syndrome check 306, then processing continues to the first of one or more decoding iterations 308 (called "local iterations"). Decoding iteration 308 comprises three steps: 1) a belief-propagation check-node update step 310, 2) a belief-propagation bit-node update step 312, and 3) a syndrome check step 314, which is identical to step 306.

In belief-propagation check-node update step 310, each check node m uses the $Q_{nm}$ messages received from all bit nodes n in set N(m) to calculate one or more check-node or R messages, denoted $R_{mn}$, according to the following Equations (2), (3), and (4):

$$R_{mn}^{(i)} = \delta_{mn}^{(i)} \max(\kappa_{mn}^{(i)} - \beta, 0) \quad (2)$$

$$\kappa_{mn}^{(i)} = |R_{mn}^{(i)}| = \min_{n' \in N(m) \setminus n} |Q_{n'm}^{(i-1)}| \quad (3)$$

$$\delta_{mn}^{(i)} = \left( \prod_{n' \in N(m) \setminus n} \operatorname{sgn}(Q_{n'm}^{(i-1)}) \right) \quad (4)$$

where i is the decoding iteration, N(m)\n is set N(m) excluding bit node n, the function sgn returns the sign of its operand, and β is a positive constant, the value of which depends on the code parameters. Each check node m sends the calculated $R_{mn}$ messages back along those same edges to all bit nodes n in set N(m).

Next, in belief-propagation bit-node update step 312, each bit node n calculates one or more $Q_{nm}$ messages according to the following Equation (5):

$$Q_{nm}^{(i)} = L_n^{(0)} + \sum_{m' \in M(n) \setminus m} R_{m'n}^{(i)} \quad (5)$$

where $L_n^{(0)}$ is the original $L_{ch}$ value for bit node n, and M(n)\m is set M(n) excluding check node m. Each bit node n then sends the calculated $Q_{nm}$ messages to all check nodes m in set M(n).

Also during bit-node update step 312, each bit node n updates its $\hat{x}_n$ value according to the following Equations (6) and (7):

$$E_n^{(i)} = \sum_{m' \in M(n)} R_{m'n}^{(i)} \quad (6)$$

$$P_n = L_n^{(0)} + E_n^{(i)} \quad (7)$$

If $P_n \geq 0$, then $\hat{x}_n = 0$, and if $P_n < 0$, then $\hat{x}_n = 1$. The values generated by Equation (6) are also referred to as extrinsic or E values, and denoted $E_{LDPC}$. The values generated by Equation (7) are referred to as P values. The specific belief-propagation algorithm represented by Equations (2)-(7) is known as the min-sum algorithm. Note that the $\hat{x}_n$ values are updated during each decoding iteration 308 and finally outputted by decoding process 300. The original LLR values $L_{ch}$ remain unchanged during decoding process 300.

Bit-node update step 312 sends to syndrome check step 314 a vector $\hat{x}$ constructed out of the current $\hat{x}_n$ values of the decoder. The syndrome check of step 314 is identical to the syndrome check of step 306 discussed above. If vector $\hat{x}$ passes syndrome check 314, then vector $\hat{x}$ is sent to CRC step 318.

LDPC Decoding: Cyclic Redundancy Check and Mis-Satisfied Check Nodes

Passing syndrome check 306 or 314 means that vector $\hat{x}$ is a valid decoded codeword, but not necessarily the decoded correct codeword (DCCW). It is possible for an LDPC decoder to generate a valid decoded codeword that is not the DCCW. In that case, there are no USCs in vector $\hat{x}$, but there are mis-satisfied check nodes (MSCs). A mis-satisfied check node is a check node that is associated with an even number of erroneous bit-nodes.

Thus, to ensure that valid vector $\hat{x}$ is the DCCW, process 300 passes vector $\hat{x}$ to cyclic redundancy check (CRC) 318. A CRC check is a checksum operation that can detect alteration of data during transmission or storage. Specifically, an encoder computes a first CRC checksum of a codeword that is to be sent, and sends both the first CRC checksum and the codeword to the decoder. The decoder, upon receipt of the codeword and the first CRC checksum, computes a second CRC checksum using the received codeword, and compares it to the first CRC checksum. If the two CRC checksums do not match, then there is a high probability that there are errors in the received codeword.

If vector $\hat{x}$ passes the CRC check, then vector $\hat{x}$ is the DCCW, and process 300 sets global variable DCCW to true, outputs vector $\hat{x}$, and terminates at step 320. Otherwise, vector $\hat{x}$ is not the DCCW, and process 300 sets global variable DCCW to false, outputs vector $\hat{x}$, and terminates at step 320. Global variable DCCW informs other decoding processes whether or not the DCCW has been generated.

Returning to step 314, if vector $\hat{x}$ fails the syndrome check, then there exist one or more USCs in vector $\hat{x}$. The typical method for resolving USCs is to perform another decoding iteration 308. However, in a particular decoding session, there might exist one or more USCs that will never be satisfied in a reasonable amount of time (see the discussion of trapping sets, below). Thus, LDPC decoders are typically limited in how many decoding iterations they can perform. Typical values for the maximum number of iterations range from 50 to 200.

In FIG. 3, step 316 determines whether the specified maximum number of iterations has been reached. If not, then another decoding iteration 308 is performed. If, instead, the maximum number of iterations has been reached, then decoder process 300 has failed. In that case, process 300 sets global variable DCCW to false, outputs vector $\hat{x}$, and terminates at step 320.

A complete execution of process 300 (with one or more local decoding iterations 308) is known as a decoding session.

BER, SNR, and Error Floors

The bit-error rate (BER) of an LDPC decoder represents the probability that a decoded bit has the wrong value. Thus, for example, a decoder with a BER of $10^{-9}$ will, on average, generate one erroneous bit for every billion decoded bits. The failure of an LDPC decoding session to converge on the DCCW contributes to the BER of the decoder.

The BER of an LDPC decoder is strongly influenced by the signal-to-noise ratio (SNR) of the decoder's input signal. A graph of BER as a function of SNR typically comprises two distinct regions: an initial "waterfall" region where the BER improves (decreases) rapidly given a unit increase in SNR, and a subsequent "error-floor" region where increases in SNR yield only modest improvements in BER. Thus, achieving significant BER improvements in the error-floor region requires methods other than SNR increase.

One method for improving the error-floor characteristics of an LDPC decoding is to increase the codeword length. However, increasing codeword length also increases the memory and other computing resources required for LDPC decoding. Thus, if such resources are strictly limited, as is typically the case with the read-channel devices on storage devices, then other methods must be found to yield the necessary error-floor improvement.

Another scarce resource is processing cycles. Typically, to achieve a specified throughput, a storage device budgets a fixed number of read-channel processing cycles for decoding a codeword. Methods that exceed that budget (e.g., off-the-fly methods) decrease the throughput. More desirable are on-the-fly methods that recover the DCCW within the clock-cycle allotment and thus do not decrease the throughput.

Another way to improve the error-floor characteristics of an LDPC decoder is to use one or more post-processing methods. A post-processing method is invoked when a decoding session fails to converge on the DCCW within the maximum number of iterations allowed. A post-processing method adjusts one or more variables associated with the decoding process (e.g., y values, $L_{ch}$ values, and/or the operating parameters of the decoder) and re-starts decoding. Like decoding itself, a post-processing method is often iterative, making multiple, sequential changes to the inputs to the decoding process.

In a typical LDPC-decoding session, the decoder converges on the DCCW within the first several decoding iterations. When, instead, an LDPC decoder fails to converge on the DCCW within a specified maximum number of iterations, it is known as a failed decoder, and the decoded codeword generated by a failed decoder is a failed codeword.

Failed codewords typically are classified by the number of USC nodes they contain. An invalid decoded codeword (ICW) is a failed codeword with a large number of USC nodes (e.g., greater than 16 for an approximately 5,000-bit codeword). ICWs typically result from a decoder input codeword that contains so many bit errors, i.e., so few correct values, that the decoder is unable to correct all the bit errors. A typical post-processing method for handling an ICW is to request a re-send of the input codeword. Although a resend is an off-the-fly method and thus undesirable, it is typically the only reliable option for correcting an ICW.

A near codeword (NCW) is a failed codeword that possesses a small number of USCs (e.g., 16 or fewer for an approximately 5,000-bit codeword). Sometimes, the USCs in an NCW form a stable configuration, known as a trapping set, for which further decoding iterations will not produce the DCCW. Trapping sets have a significant impact on the error-floor characteristics of an LDPC decoder.

Trapping sets are notated (a,b), where b is the number of USCs in the trapping set, and a is the number of erroneous bit nodes associated with those USCs. Thus, an (8,2) trapping set comprises two USCs and eight erroneous bit nodes (EBNs) associated with those two USCs. The majority of trapping sets comprise fewer than five USCs and fewer than ten EBNs.

Flipping a bit node refers to a specific process for altering one or more values associated with the bit node. Which values are altered during flipping depends on the state of the LDPC decoder. In one possible implementation, if an LDPC decoder has just been initialized, then flipping a bit node comprises (i) inverting the hard-decision value of that bit node's $L_{ch}$ value, i.e., 1 becomes 0, and vice versa, (ii) setting the magnitude bits, i.e., the confidence, of that same $L_{ch}$ value to maximum, and (iii) limiting the magnitude bits of all other $L_{ch}$ values to at most 15% of the maximum allowable magnitude value.

For example, assume a system with 4-bit $L_{ch}$ magnitude values, where the maximum allowable positive magnitude is +15 and the maximum allowable negative magnitude is −16, and where 15% of the maximum allowable values would be +2 and −2, respectively. Further assume four $L_{ch}$ values corresponding to four bit nodes: +2, −11, +1, and +13. In this example, flipping the first bit node comprises (i) inverting the sign of the first bit node's $L_{ch}$ value, i.e., +2 becomes −2, (ii) setting the magnitude of the first bit node's $L_{ch}$ value to the maximum allowable value, i.e., −2 becomes −16, and (iii) limiting the magnitude of the $L_{ch}$ values of the other three bit nodes to at most 15% of the maximum allowable value, i.e., −11, +1, and +13 become −2, +1, and +2, respectively. Setting the $L_{ch}$ magnitudes to low values enables the iterative decoding process to converge more quickly on the DCCW, and lowers the chances of a failed decoder.

According to this same implementation, if the decoder is in some state other than initialized, then flipping a bit node comprises (i) determining the hard-decision value of the bit node's P value (defined by Equation 7 above), (ii) setting the hard-decision values of that bit node's $L_{ch}$ value, P value, and all associated $Q_{nm}$ messages to the opposite of the P value hard-decision value, (iii) setting the magnitude bits of that bit node's $L_{ch}$ value, P value, and all associated $Q_{nm}$ messages to maximum, and (iv) limiting the magnitude of the $L_{ch}$, P, and $Q_{nm}$ message values of all other bits to 15% of the maximum allowable value. Note that only initial magnitudes are limited. As the decoding session progresses, P and $Q_{nm}$ message values are updated and may assume any allowable value. $L_{ch}$ values, on the other hand, are read-only and thus will retain their limited magnitude values for the duration of the decoding session.

Erasing is another specific process for altering bit-node values. Erasing a bit node comprises (i) setting the hard-decision value of that bit node's $L_{ch}$ value to 0 and (ii) setting the magnitude bits, i.e., the confidence, of that same $L_{ch}$ value to 0, i.e., no confidence.

If one or more of the EBNs for a near codeword corresponding to a trapping set are adjusted (e.g., flipped or erased), then re-performing LDPC decoding on the resulting, modified codeword may converge on the DCCW. When successful, this process is referred to as breaking the trapping set. Thus, another way to improve the error-floor characteristics of an LDPC decoder is to take the near codeword (NCW) of a failed decoder, identify potential EBNs in the NCW, flip or erase one or more of those EBNs, and submit the modified NCW for further LDPC processing.

Some trapping sets can be broken by flipping or erasing a single EBN. In other trapping sets, flipping or erasing a single EBN may reduce the number of USCs, but not break the trapping set entirely, yielding a second, different trapping set that might then be broken by flipping or erasing another EBN. Yet other trapping sets can be broken only by flipping or erasing two or more EBNs at the same time.

Trapping sets vary widely based on (i) the operating conditions of the decoder (e.g., decoder alphabet, decoder algorithm, decoder check-node update method), (ii) the write errors, and (iii) the read errors. When the communications channel is a storage device, a write error is when a bit of a codeword is incorrectly written to the storage device, i.e., the value of a bit in the written encoded codeword does not match the value of the corresponding bit in the corresponding channel input codeword. A read error is when a correctly written bit of a codeword is read incorrectly from the storage device, i.e., the value of a bit in the channel output codeword does not match the value of the corresponding bit in the written encoded codeword. Recovery from read errors is possible by, e.g., re-reading a sector multiple times followed by averaging of the multiple read samples. However, recovery from write errors is not possible by re-reading a sector.

Embodiments of the present invention are methods for estimating and correcting those EBNs in an LDPC decoder input codeword that are due to write errors. The methods typically comprise a pair of processes: a write-error verification process and a write-error recovery process. The write-error verification process is performed when a codeword is written to a storage medium. The write-error recovery process is performed at a later time, when the codeword is read from the storage medium and decoded.

Figure 4:
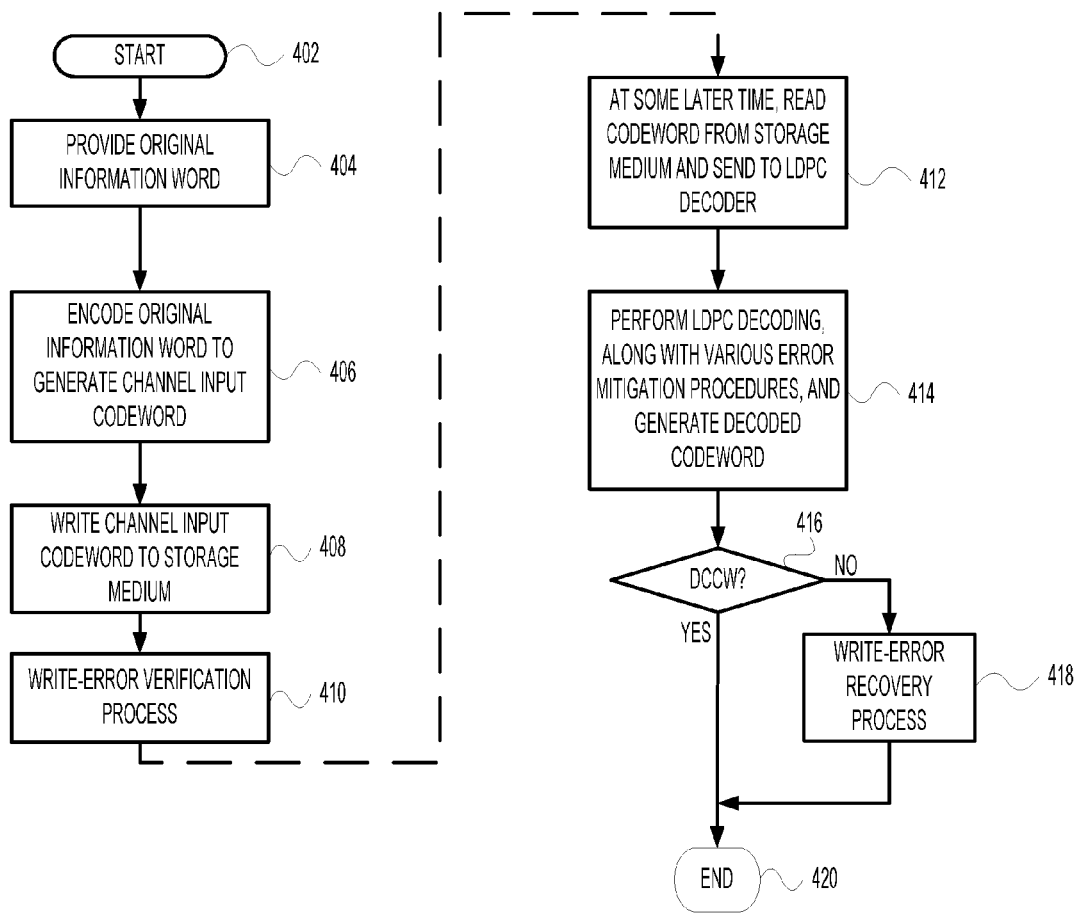
FIG. 4 is a flow diagram of LDPC encoding/decoding process 400 implemented by communication system 100 of FIG. 1 as controlled by channel controller 120 according to one embodiment of the invention.

FIG. 4 is a flow diagram of LDPC encoding/decoding process 400 implemented by communication system 100 of FIG. 1 as controlled by channel controller 120 according to one embodiment of the invention. Processing begins at step 402 and continues to step 404, where data source 102 provides an original information word 104 to LDPC encoder 106. Next, at step 406, LDPC encoder 106 encodes original information word 104 to generate a channel input codeword 108. Next, at step 408, channel input codeword 108 is written to a storage medium 110 (e.g., a flash drive). Next, a step 410, a write-error verification process is performed, which process is described in greater detail in the discussion of FIGS. 6 and 7, below.

At some later time, at step 412, the stored codeword is read from storage medium 110, detected by channel detector 112, and the $L_{ch}$ values for a corresponding decoder input codeword are sent to LDPC decoder 114. Next, at step 414, LDPC decoder 114 processes the decoder input codeword to generate a decoded codeword. The processing includes LDPC decoding and various read-event methods, such as error-floor mitigation methods, media-defect detection methods, and standard channel-retry methods. The net effect of the processing of step 414 is that all EBNs due to read errors are corrected, and any EBNs remaining in the decoded codeword are write errors.

Next, at step 416, it is determined whether the decoded codeword possesses any erroneous bits. If not, then the decoded codeword is the DCCW, and the process ends at step 420. If, instead, the decoded codeword possesses one or more erroneous bits, then, at step 418, a write-error recovery process is performed on the decoded codeword, which process is described in greater detail in the discussion of FIG. 8 below.

Write-error verification process 410 is executed when a channel input codeword is initially written to a storage medium, e.g., a flash drive, as a written encoded codeword. The write-error verification process reads the written encoded codeword back and generates a corresponding decoder input codeword. The process then performs LDPC decoding on the decoder input codeword to generate a decoded codeword. The process then compares the channel input codeword to the decoded codeword and determines the number and indices of any erroneous bits. If the number of erroneous bits is greater than 0 and less than a specified threshold, then the process writes erroneous-bit information to a data structure called the erroneous-bit table. In one embodiment of the present invention, the erroneous-bit information comprises a codeword identifier (e.g., a flash-drive page ID) and the indices of one or more of the erroneous bits. The index of an erroneous bit identifies the location of the erroneous bit in the decoded codeword. The erroneous-bit table is typically stored on the storage medium.

FIG. 5 is a diagram of one embodiment of an erroneous-bit table. Table 500 comprises three columns (fields) and any number of rows (records). Column CODEWORD_IDENTIFIER contains the codeword identifier (e.g., flash-drive page ID). Column EB_INDICES contains the indices one or more erroneous bits identified by the write-error verification process. Column COMPLETE_SET is a one-bit true/false field that indicates whether the erroneous-bit indices identified in column EB_INDICES represent all of the erroneous-bit indices detected by the write-error verification process (i.e., true or 1) or a proper subset (i.e., false or 0).

Figure 6:
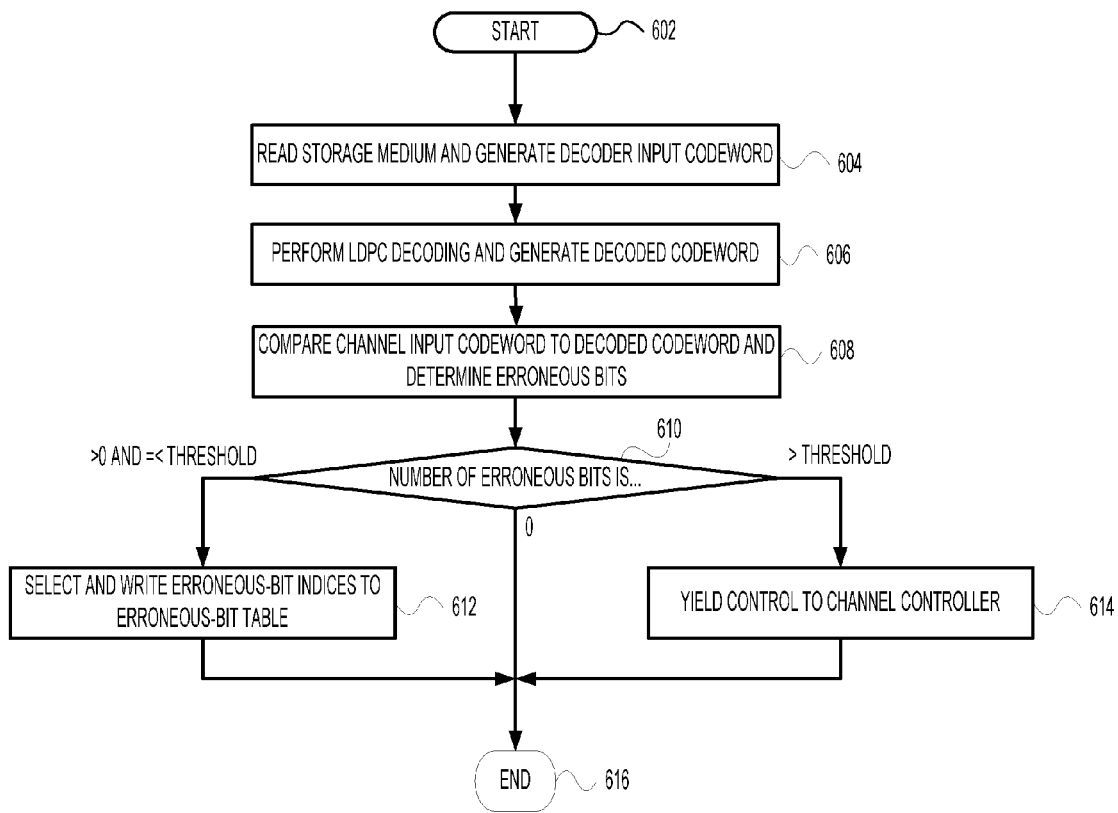
FIG. 6 is a flow diagram of step 410 of FIG. 4, i.e., the write-error verification process, according to one embodiment of the invention.

FIG. 6 is a flow diagram of step 410 of FIG. 4, i.e., the write-error verification process, according to one embodiment of the invention. Processing begins at step 602 and proceeds to step 604, where the written encoded codeword is read from the storage medium, and a decoder input codeword is generated.

Next, at step 606, LDPC decoding is performed on the decoder input codeword, along with various read-event methods (e.g., error-floor mitigation methods, media-defect detection methods, standard channel-retry methods), and a decoded codeword is generated. The net effect of the processing of step 606 is that any and all erroneous bits due to read errors are corrected, and any erroneous bits remaining in the decoded codeword are due to write errors. Next, at step 608, the decoded codeword is compared bit-wise to the channel input codeword, and the number and indices of any erroneous bits (corresponding to bit mismatches) are determined.

If, at step 610, the number of erroneous bits is 0 (i.e., the decoder converged on the DCCW in step 606), then write-error verification process 410 terminates at step 616. If, instead, the number of erroneous bits exceeds a specified threshold (e.g., 32), then, at step 614, control is yielded to the channel controller 120 of FIG. 1, which might execute its own methods to correct the errors. For example, channel controller 120 might decide to mark the current location on the storage medium (e.g., flash-drive page) as bad, and attempt to write channel input codeword 108 to another location. Channel-controller methods tend to be specific to the particular channel controller and the channel-controller manufacturer. If, instead, the number of erroneous bits is greater than 0, but less than or equal to the specified threshold, then, at step 612, one or more erroneous-bit indices are written to an erroneous bit table.

Table limit L specifies the maximum number of erroneous-bit indices that may be stored for any codeword in the erroneous-bit table. It is not always necessary to store information about all erroneous bits identified. Research has shown that, for 5,000-bit LDPC codewords, for a trapping set with more than three EBNs, flipping any three of those EBNs will break the trapping set. Thus, there typically is no need to store more than three erroneous bits per codeword in the erroneous-bit table. In that case, 3 is the table limit L.

Furthermore, most trapping sets can be broken by flipping one or two EBNs. If the decision is made to store only one or two erroneous-bit indices, i.e., L is 1 or 2, and the number of identified erroneous bits is greater than L, then the L selected indices are tested to ensure that flipping the bits at those indices allows the decoder to converge on the DCCW. If not, other sets of L indices are selected and tested until either (i) the decoder converges on the DCCW or (ii) no more subsets are available.

Figure 7:
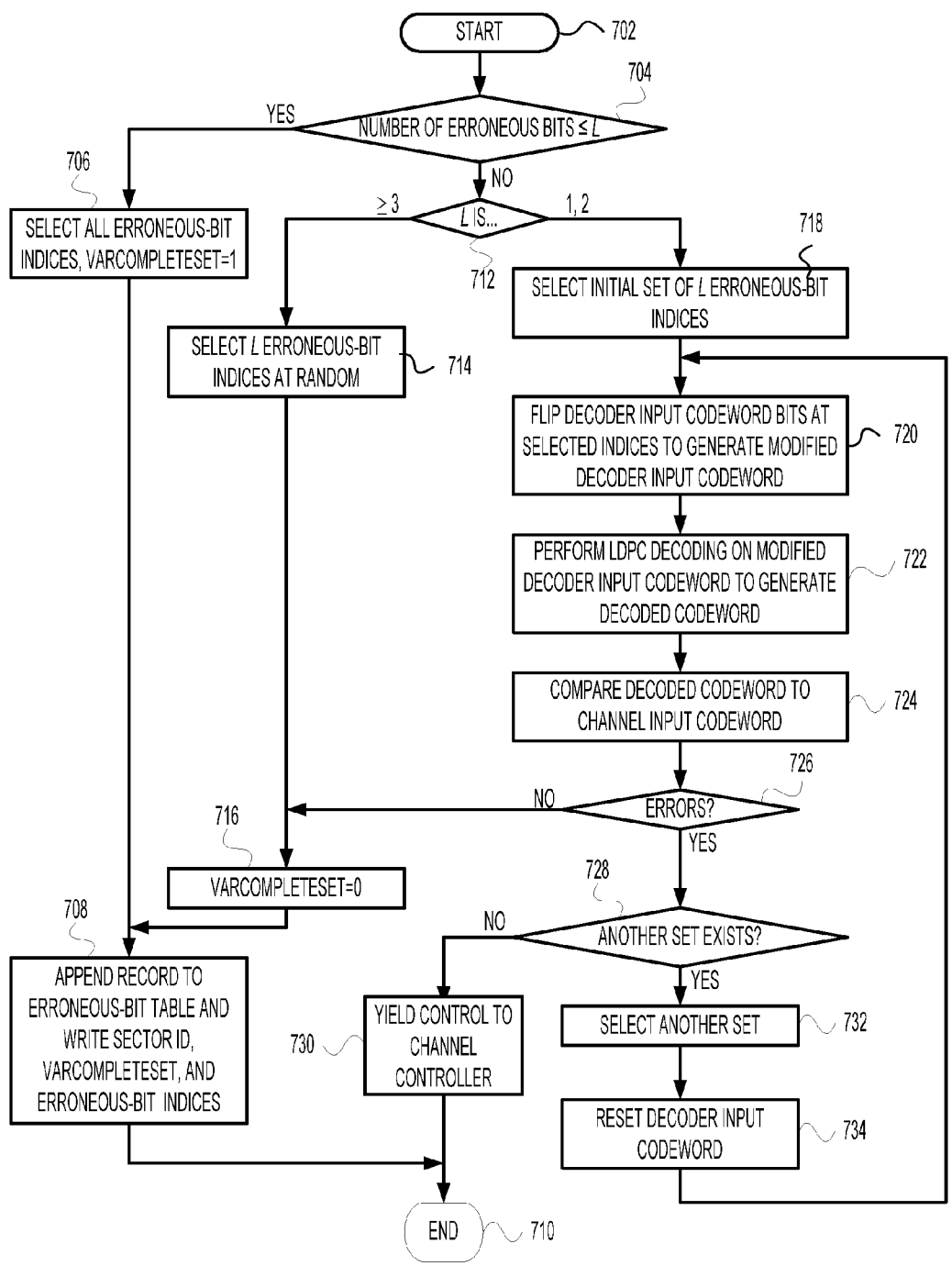
FIG. 7 is a flowchart of step 612 of FIG. 6.

FIG. 7 is a flowchart of step 612 of FIG. 6. Process 612 selects which, if any, of the erroneous-bit indices detected in step 607 of FIG. 6 will be written to the erroneous-bit table.

Processing begins at step 702 and proceeds to step 704 where it is determined whether the number of erroneous bits is less than or equal the table limit L.

If, at step 704, the number of erroneous bits is less than or equal to L, then all erroneous bit indices are selected at step 706, and the value of variable VARCOMPLETESET is set to 1 (true). Next, at step 708, a record is appended to the erroneous-bit table (e.g., 500 of FIG. 5). The fields of the appended record are set as follows. Field CODEWORD_IDENTIFIER is set equal to a unique codeword identifier (e.g., flash-drive page ID). Field COMPLETE_SET is set to the value of VARCOMPLETESET. The selected erroneous-bit indices are stored to EB_INDICES.

If, instead, at step 704, the number of erroneous bits is greater than L, then, at step 712, it is determined whether L is greater than or equal to 3. If so, then at step 714, L erroneous-bit indices are selected at random, and VARCOMPLETESET is set to 0. Processing then continues to step 716, where variable VARCOMPLETESET is set to 0 (i.e., less than all the erroneous-bit indices are being stored to the erroneous-bit table). Processing then proceeds to step 708 (described above) and terminates at step 710.

If, instead, at step 712, L is 1 or 2, then processing continues to step 718, where L erroneous-bit indices are selected. Next, at step 720, those bits in the original decoder input codeword at the selected indices are flipped to yield a modified decoder input codeword. Next, at step 722, LDPC decoding is performed on the modified decoder input codeword to generate a decoded codeword. Then, at step 724, the decoded codeword is compared to the channel input codeword. If there are no erroneous bits in the decoder output codeword (step 726), then, at step 716, VARCOMPLETESET is set to 0, and processing proceeds to steps 708 and 710 (described above)

If, instead, at step 726, it is determined that the decoded codeword contains any erroneous bits, then, at step 728, it is determined whether another set of L erroneous-bit indices exists. If so, at step 732, another set is selected. Then, at step 734, the decoder input codeword is reset to the original decoder input codeword (i.e., the changes made in step 720 are undone), and processing loops to step 720.

If, instead, at step 728, no other sets of L erroneous-bit indices exist, then the process 612 yields control to the channel controller at step 730, and terminates at step 710. See the explanation of step 614 of FIG. 6, above, for a discussion of the channel controller.

Write-error recovery process 418 of FIG. 4 is executed at a later time, when the system reads a written encoded codeword from the storage medium, and the LDPC decoder fails to converge on the DCCW within the specified maximum number of decoding iterations. The write-error recovery process uses a unique codeword identifier (e.g., flash-drive page ID) to search the erroneous-bit table for a record matching the failed decoded codeword. If a match is found, then the erroneous-bit indices are retrieved from the matching record, and the values of the failed decoded codeword bits at the retrieved indices are flipped to yield a modified codeword.

If the stored erroneous-bit indices represent all the erroneous-bit indices detected during the write-verification process (i.e., COMPLETE_SET=1), then the modified codeword is typically submitted to only a syndrome check and a cyclic redundancy check. A syndrome check determines whether the modified decoder input codeword is a valid LDPC codeword, and the cyclic redundancy check determines whether that valid LDPC codeword is the DCCW.

If, instead, the stored erroneous-bit indices represent fewer than all of the erroneous-bit indices detected during the write-verification process (i.e., COMPLETE_SET=0), then the modified decoded codeword is submitted to further LDPC decoding (e.g., process 300 of FIG. 3 without initialization step 304). The write-error recovery process terminates when either (i) the further decoding converges on the DCCW or (ii) the decoder fails to converge on the DCCW within the specified maximum number of decoding iterations.

Figure 8:
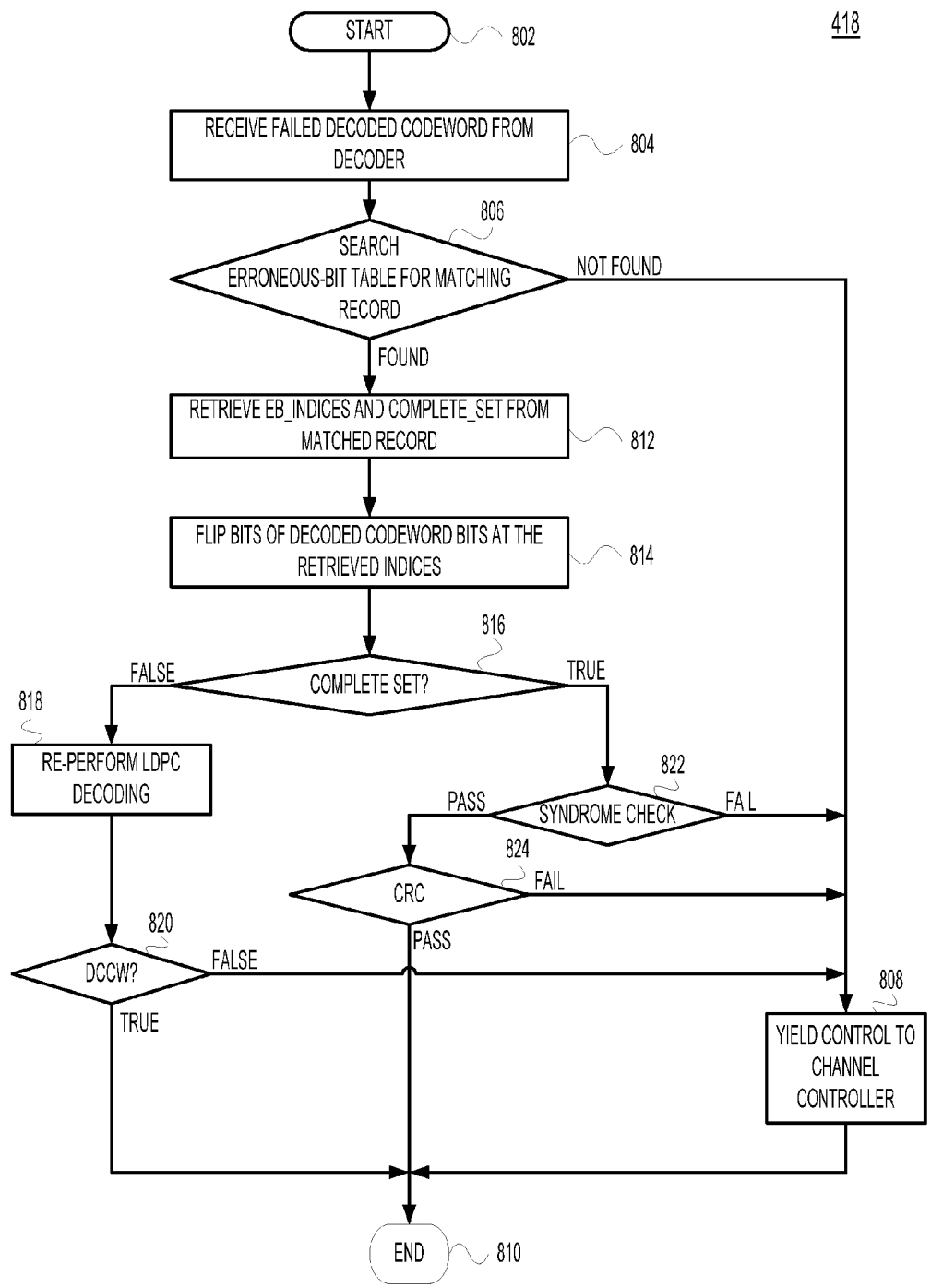
FIG. 8 is a flowchart of write-error recovery process 418 of FIG. 4 according to one embodiment of the present invention.

FIG. 8 is a flowchart of write-error recovery process 418 of FIG. 4 according to one embodiment of the present invention. Processing begins at step 802 and proceeds to step 804 where a failed decoded codeword is received from the LDPC decoder. Next, at step 806, process 418 searches the erroneous-bit table (e.g., 500 of FIG. 5) for a match to the decoded codeword, e.g., searching by flash-drive page ID. If a match is not found, then process 418 yields control to the channel controller at step 808 and then terminates at step 810; otherwise, at step 812, the values of EB_INDICES and COMPLETE_SET are retrieved from the bit-error table.

Next, at step 814, process 418 flips the values of the decoded codeword bits at the retrieved erroneous-bit indices to yield a modified codeword. Flipping is above. Next, at step 816, if COMPLETE_SET is 0 (i.e., only a proper subset of erroneous-bit indices was stored in the erroneous-bit table), then the modified codeword is submitted to LDPC decoding at step 818. If step 818 yields the DCCW (step 820), then process 418 terminates at step 810. If step 818 does not yield the DCCW, then, at step 808, control is yielded to the channel controller, and process 418 terminates at step 810.

If, on the other hand, at step 816, COMPLETE_SET is 1 (i.e., all erroneous-bit indices were stored in the erroneous-bit table), then the modified codeword is submitted to a syndrome check at step 822. If the modified codeword fails the syndrome check, then process 418 yields control to the channel controller (step 808), and terminates at step 810. If, instead, the modified decoder input codeword passes the syndrome check at step 822, then a CRC check is performed at step 824. If the modified decoder input codeword passes the CRC check, then processing terminates at step 810. If, instead, at step 824, the modified codeword does not pass the CRC check, then control is yielded to the channel controller (step 808), and process 418 terminates at step 810.

In another embodiment of write-recovery process 410, step 814 flips bits in the decoder input codeword, and not in the decoded codeword.

In summary, embodiments of the present invention are methods for generating the DCCW from an NCW that contains write errors. The methods typically comprise a write-verification process and a write-error recovery process. Executed when a channel input codeword is written to a storage medium, the write-verification process identifies write errors, e.g., erroneous bits, in the written codeword, and stores the indices of one or more of the erroneous bits to an erroneous-bit table. Executed at some later time, when a decoder attempts to decode the codeword and fails with an NCW, the write-recovery process searches the erroneous-bit table for erroneous-bit indices associated with the NCW. If the associated erroneous-bit indices are found, then the corresponding bits in the NCW are flipped, and the NCW is submitted to further LDPC decoding.

Although the present invention has been described in the context of hard disk drives and flash drives, the invention is not so limited. In general, the present invention can be implemented with any suitable storage medium.

Yet further, although embodiments of the present invention have been described in the context of LDPC codes, the present invention is not so limited. Embodiments of the present invention could be implemented for any code which can be defined by a graph, e.g., tornado codes, structured IRA codes, since it is graph-defined codes which suffer from trapping sets.

The present invention can be embodied in the form of methods and apparatuses for practicing those methods. The present invention can also be embodied in the form of program code embodied in tangible media, such as magnetic recording media, optical recording media, solid state memory, floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium or loaded into and/or executed by a machine, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The invention claimed is:

1. A machine-implemented method for storing an original encoded codeword to a storage medium, the method comprising:
    (a) writing the original encoded codeword to the storage medium as a written encoded codeword;
    (b) generating a channel output codeword by reading the written encoded codeword from the storage medium;
    (c) comparing the original encoded codeword to a derived codeword based on the channel output codeword to identify a first set of one or more erroneous bits in the written encoded codeword;
    (d) generating a second set of one or more erroneous bits in the written encoded codeword by selecting one or more erroneous bits in the first set; and
    (e) writing, to the storage medium, erroneous-bit information corresponding to the one or more erroneous bits in the second set.

2. The invention of claim 1, wherein the original encoded codeword is a low-density parity-check codeword.

3. The invention of claim 1, wherein step (c) further comprises performing decoding on the channel output codeword to generate the derived codeword.

4. The invention of claim 1, wherein the second set is equal to the first set.

5. The invention of claim 1, wherein the second set is a proper subset of the first set.

6. The invention of claim 1, further comprising:
    (f) generating a decoder input codeword by reading the written encoded codeword from the storage medium;
    (g) performing decoding on the decoder input codeword to generate a decoded codeword; and
    (h) if the decoded codeword is not a decoded correct codeword, then:
        (h1) reading the erroneous-bit information from the storage medium;
        (h2) generating a modified codeword based on the erroneous-bit information; and
        (h3) performing further processing on the modified codeword.

7. The invention of claim 6, wherein step (h2) comprises modifying one or more bits in the decoded codeword based on the erroneous-bit information to generate the modified codeword.

8. The invention of claim 6, wherein step (h3) comprises:
    (h3i) determining whether or not the erroneous-bit information corresponds to all of the erroneous bits in the first set;
    (h3ii) if the erroneous-bit information correspond to all of the erroneous bits in the first set, then the further processing comprises performing one or more of a syndrome check and a cyclic redundancy check (CRC) on the modified codeword; and
    (h3iii) if the erroneous-bit information does not correspond to all of the erroneous bits in the first set, then the further processing comprises performing decoding on the modified codeword.

9. The invention of claim 1, wherein the erroneous-bit information comprises:
    a unique identifier for the written encoded codeword;
    an index value for each erroneous bit in the second set; and
    an indication whether the second set corresponds to all of the erroneous bits in the first set.

10. The invention of claim 1, wherein step (d) comprises:
    (d1) selecting one or more erroneous bits in the first set;
    (d2) generating a modified codeword based on the one or more selected erroneous bits;
    (d3) performing decoding on the modified codeword to generate a candidate decoded codeword;
    (d4) determining whether the candidate decoded codeword is a decoded correct codeword;
    (d5) if the candidate decoded codeword is the decoded correct codeword, then generating the second set based on the one or more selected erroneous bits; and
    (d6) if the candidate decoded codeword is not the decoded correct codeword, then repeating steps (d1)-(d4) for another one or more selected erroneous bits in the first set.

11. A machine-implemented method for generating a decoded codeword for a written encoded codeword stored in a storage medium, the written encoded codeword having one or more erroneous bits, the method comprising:
    (a) generating a channel output codeword by reading the written encoded codeword from the storage medium;
    (b) generating a derived codeword based on the channel output codeword;

(c) reading erroneous-bit information from the storage medium, wherein the erroneous-bit information corresponds to one or more erroneous bits in the written encoded codeword;

(d) generating a modified codeword based on the erroneous-bit information; and (e) performing processing on the modified codeword to generate the decoded codeword.

12. The invention of claim 11, wherein the written encoded codeword is a low-density parity-check codeword.

13. The invention of claim 11, wherein step (b) comprises:

(b1) performing decoding on the channel output codeword to generate the derived codeword; and (b2) determining that the derived codeword is not a decoded correct codeword.

14. The invention of claim 11, wherein step (d) comprises modifying one or more bits in the derived codeword based on the erroneous-bit information to generate the modified codeword.

15. The invention of claim 11, wherein step (e) comprises:

(e1) determining whether or not the erroneous-bit information corresponds to all of the erroneous bits in the written encoded codeword;

(e2) if the erroneous-bit information correspond to all of the erroneous bits in the written encoded codeword, then the processing comprises performing one or more of a syndrome check and a cyclic redundancy check (CRC) on the modified codeword; and (e3) if the erroneous-bit information does not correspond to all of the erroneous bits in the written encoded codeword, then the processing comprises performing decoding on the modified codeword.

16. The invention of claim 11, wherein the erroneous-bit information comprises:

a unique identifier for the written encoded codeword;

an index value for each erroneous bit in the written encoded codeword; and an indication whether the erroneous-bit information corresponds to all of the erroneous bits in the written encoded codeword.

\* \* \* \* \*